(12) United States Patent
An et al.

(10) Patent No.: US 9,508,438 B2
(45) Date of Patent: Nov. 29, 2016

(54) SEMICONDUCTOR MEMORY DEVICE, MEMORY SYSTEM HAVING THE SAME AND OPERATING METHOD THEREOF

(71) Applicant: SK hynix Inc., Incheon-si Gyeonggi-do (KR)

(72) Inventors: Chi Wook An, Icheon-si (KR); Min Kyu Lee, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/542,920

(22) Filed: Nov. 17, 2014

(65) Prior Publication Data

US 2015/0364197 A1     Dec. 17, 2015

(30) Foreign Application Priority Data

Jun. 12, 2014     (KR) .................. 10-2014-0071544

(51) Int. Cl.
| | |
|---|---|
| *G11C 16/04* | (2006.01) |
| *G11C 16/10* | (2006.01) |
| *G11C 16/34* | (2006.01) |
| *G11C 11/56* | (2006.01) |
| *G11C 16/12* | (2006.01) |

(52) U.S. Cl.
CPC ........... *G11C 16/10* (2013.01); *G11C 11/5628* (2013.01); *G11C 16/12* (2013.01); *G11C 16/3459* (2013.01)

(58) Field of Classification Search
CPC ... G11C 16/10; G11C 11/5628; G11C 16/30; G11C 16/3454; G11C 16/3459; G11C 16/26
USPC .......................... 365/185.19, 185.22, 185.18
See application file for complete search history.

(56) References Cited

U.S. PATENT DOCUMENTS

| | | | | |
|---|---|---|---|---|
| 2003/0235080 A1* | 12/2003 | Yaegashi | ............ | G11C 16/3468 365/185.22 |
| 2013/0141998 A1* | 6/2013 | Jeong | ..................... | G11C 16/10 365/218 |
| 2014/0140137 A1* | 5/2014 | Kondo | ................ | G11C 11/5628 365/185.17 |
| 2014/0369134 A1* | 12/2014 | Baik | ................. | G11C 16/3459 365/185.22 |

FOREIGN PATENT DOCUMENTS

| | | |
|---|---|---|
| KR | 1020120005831 A | 1/2012 |
| KR | 1020120005835 A | 1/2012 |

* cited by examiner

*Primary Examiner* — Huan Hoang
(74) *Attorney, Agent, or Firm* — William Park & Associates Ltd.

(57) ABSTRACT

An embodiment of the invention may provide a semiconductor memory device including a memory cell array including a plurality of memory cells, a peripheral circuit unit configured to perform a program operation with respect to a memory cell selected from the plurality of memory cells, wherein first to third program voltage applying operations and first to third verifying operations are alternatively performed, and a control logic configured to control the peripheral circuit unit to perform the first to third program voltage applying operations and the first to third verifying operations and to increase a second program voltage applied during the second program voltage applying operation more than a first program voltage applied during the first program applying operation by a first step voltage and a third program voltage applied during the third program voltage applying operation more than the second program voltage by a second step voltage.

23 Claims, 6 Drawing Sheets

SEMICONDUCTOR MEMORY DEVICE, MEMORY SYSTEM HAVING THE SAME AND OPERATING METHOD THEREOF

CROSS-REFERENCE TO RELATED APPLICATION

The present application claims priority to Korean Patent Application Number 10-2014-0071544, filed on Jun. 12, 2014, the entire disclosure of which is incorporated herein in its entirety by reference.

BACKGROUND

Field of Invention

Various embodiments of the invention relate generally to an electronic device and a method, and more particularly, to a semiconductor memory device, a memory system having the same and an operating method thereof.

Description of Related Art

Semiconductor memory devices are memory devices implemented using semiconductor materials such as silicon (Si), germanium (Ge), gallium arsenide (GaAs), indium phosphide (InP), or the like. Semiconductor memory devices are typically classified as volatile memory devices or as non-volatile memory devices.

A volatile memory device is a memory device where the data stored in the volatile memory device is lost when power to the memory device is cut off. Examples of volatile memory devices include a static random access memory (SRAM), a dynamic RAM (DRAM), a synchronous DRAM (SDRAM), and the like. A non-volatile memory device is a memory device in which the data stored in the non-volatile memory device is retained or maintained when the power to the memory device is cut off. Examples of non-volatile memory devices include a read-only memory (ROM), a programmable ROM (PROM), an erasable programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), or the like. A flash memory is typically classified as a NOR type or a NAND type memory device.

SUMMARY

An embodiment of the invention may provide a semiconductor memory device including a memory cell array including a plurality of memory cells. The semiconductor memory device may also include a peripheral circuit unit configured to perform a program operation with respect to a memory cell selected from the plurality of memory cells, wherein first to third program voltage applying operations and first to third verifying operations are alternatively performed. The semiconductor memory device may also include a control logic configured to control the peripheral circuit unit to perform the first to third program voltage applying operations and the first to third verifying operations and to increase a second program voltage applied during the second program voltage applying operation more than a first program voltage applied during the first program applying operation by a first step voltage and a third program voltage applied during the third program voltage applying operation more than the second program voltage by a second step voltage.

A memory system according to an embodiment may include a semiconductor memory device including a plurality of programmable memory cells and a controller configured to control a program operation of the semiconductor memory device upon receipt of a program command from a host. The semiconductor memory device alternately performs first to fourth program operations and first to third verifying operations depending on a control of the controller. First to fourth program voltages used in the first to fourth program operations, respectively, may be increased further by different step voltages.

A method of operating a semiconductor memory device according to an embodiment may include performing a first program voltage applying operation by applying a first program voltage to a plurality of memory cells. The method may also include performing a first verifying operation by setting a maximum threshold voltage value from a threshold voltage distribution of the plurality of memory cells to a fourth verifying voltage. Further, the method may include setting a half (½) point of a width of the threshold voltage distribution to a first verifying voltage and using the first verifying operation voltage. In addition, the method may include performing a second program voltage applying operation using a second program voltage increased by more than the first program voltage by a first step voltage when a fail is determined as a result of the first verifying operation. The method may also include performing a second verifying operation by setting a middle voltage between the first verifying voltage and the fourth verifying voltage to a second verifying voltage and using the second verifying voltage. Further, the method may include performing a third program voltage applying operation using a third program voltage increased by more than the second program voltage by a second step voltage when a fail is determined as a result of the second verifying operation.

DETAILED DESCRIPTION

Figure 1:
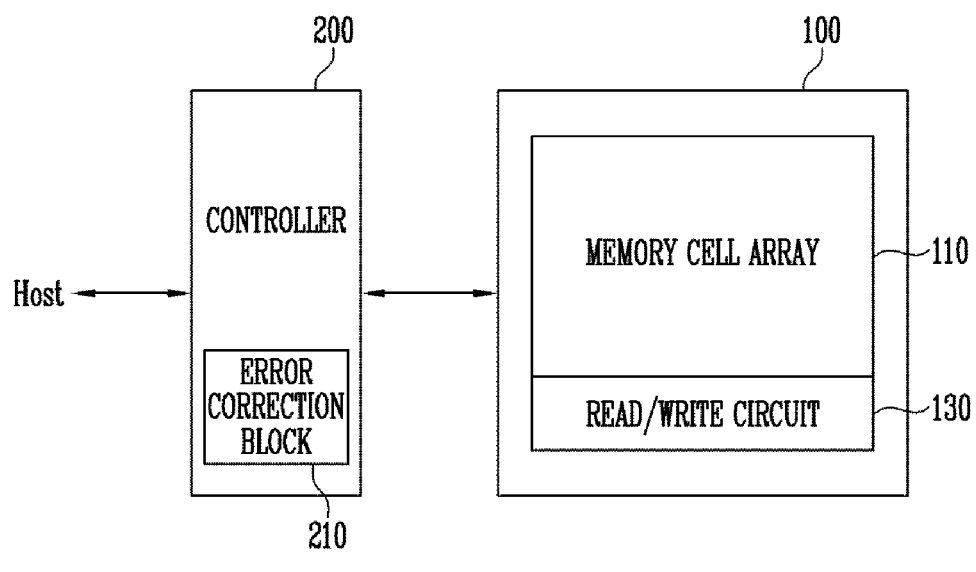
FIG. 1 is a block diagram illustrating a memory system including a semiconductor memory device.

Hereinafter, an embodiment of the invention will be described. In the drawings, the thicknesses and the lengths of elements may be exaggerated for convenience of illustration. In describing the invention, configurations, structures, and methods commonly known to those skilled in the art may be omitted to avoid obscuring the invention. Throughout the drawings, like reference numerals refer to like elements. Accordingly, various embodiments of the invention are directed to a semiconductor memory device capable of reducing programming time when performing a program operation, a memory system having the same and an operating method.

Throughout the detailed description, when an element is referred to as being "electrically coupled" to another element, it includes that the element can be "directly electrically coupled" to the other element or "indirectly electrically coupled" to the other element with other intervening element (s). Further, it will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Referring to FIG. 1, a block diagram illustrating a memory system 10 including a semiconductor memory device 100 is shown.

The memory system 10 may include the semiconductor memory device 100 and a controller 200. The semiconductor memory device 100 may include a memory cell array 110 and a read/write circuit 130 electrically coupled to the memory cell array 110.

The memory cell array 110 may include a plurality of memory cells. Each of the plurality of memory cells may be defined as a multi-level memory cell storing two or more data bits.

The semiconductor memory device 100 may operate in response to control of the controller 200. The semiconductor memory device 100 may be configured to perform a program operation with respect to memory cells (selected memory cells) indicated by an address received along with a program command as the program command is received from the controller 200. The semiconductor memory device 100 may include alternately performing a plurality of program voltage applying operations and a plurality of verifying operations. A verifying operation may be performed after a program voltage applying operation using an incremental step pulse program (ISPP) method is performed. If the verifying operation is passed, a program voltage may be set by reducing a step voltage in half. The program voltage applying operation may be performed by using the set program voltage. In addition, a verifying level of any one of the verifying operations may be increased compared to that of the previous verifying operation. Further, a range of the increase may be set to a half of a range of increase of the previous verifying operation. Program operations will be described below.

In an embodiment, the semiconductor memory device 100 may be a flash memory device. However, the invention is not limited thereto.

The controller 200 may be electrically coupled between the semiconductor memory device 100 and the host Host. The controller 200 may be configured to cause the host Host to interface with the semiconductor memory device 100 and vice versa. For example, when a read or program operation is performed upon request from the host Host, the controller 200 may convert a logical block address received from the host Host into a physical block address. In addition, the controller 200 may provide the converted physical block address to the semiconductor memory device 100 along with a corresponding command. Further, when the program operation is performed, information relating to a set program voltage may be sent to the semiconductor memory device 100.

In an embodiment, the controller 200 may include an error correction block 210. The error correction block 210 may be configured to detect and correct an error in data received from the semiconductor memory device 100. The error correction function performed by the error correction block 210 may be restricted according to a number of error bits among the data received from the semiconductor memory device 100. When the number of error bits among the data received from the semiconductor memory device 100 is smaller than a specific value, the error correction block 210 may perform error detection and correction functions. When the number of the error bits among the data received from the semiconductor memory device 100 is greater than a specific value, the error detection and correction functions may not be performed. If the error detection and correct functions are not performed, the controller 200 may control the semiconductor memory device 100 to control a read voltage applied to a selected word line.

Figure 2:
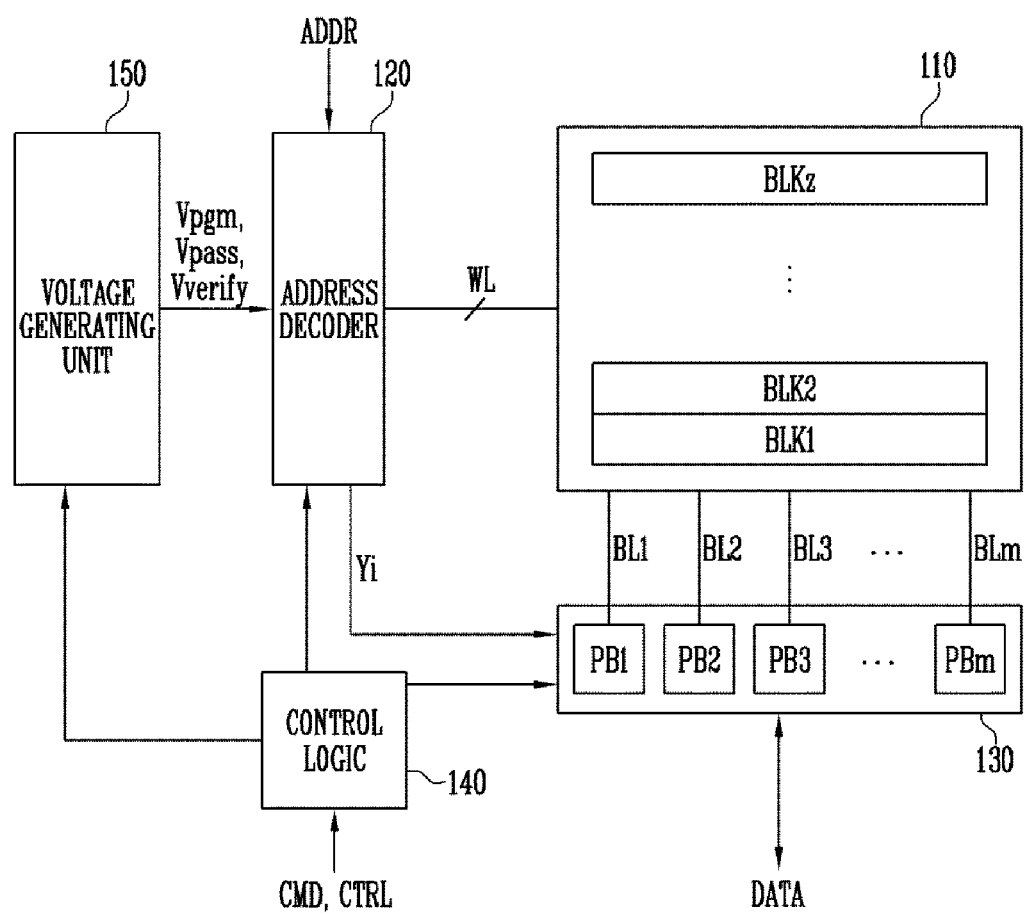
FIG. 2 is a block diagram illustrating in more detail the semiconductor memory device shown in FIG. 2.

Referring to FIG. 2, a block diagram illustrating the semiconductor memory device shown in FIG. 1 is illustrated.

The semiconductor memory device 100 may include the memory cell array 110, an address decoder 120, the read/write circuit 130, a control logic 140 and a voltage generating unit 150.

The memory cell array 110 may include a plurality of memory blocks BLK1 to BLKz. The plurality of memory blocks BLK1 to BLKz may be electrically coupled to word lines WL through the address decoder 120.

The plurality of memory blocks BLK1 to BLKz may be electrically coupled to the read/write circuit 130 through bit lines BL1 to BLm. Each of the plurality of memory blocks BLK1 to BLKz may include a plurality of memory cells. In an embodiment, the plurality of memory cells may be nonvolatile memory cells. The plurality of memory cells may define memory cells electrically coupled to the same word line as one page. More specifically, the memory cell array 110 may be a plurality of pages.

The address decoder 120, the read/write circuit 130 and the voltage generating unit 150 may operate as a peripheral circuit which drives the memory cell array 110.

The address decoder 120 may be electrically coupled to the memory cell array 110 via the word lines WL. The address decoder 120 may be configured to operate in response to control of the control logic 140. The address decoder 120 may receive an address ADDR through an input/output buffer in the semiconductor memory device 100. The address ADDR may be provided from the controller 200 (refer back to FIG. 1).

The address decoder 120 may decode a row address among the address ADDR received when a program voltage applying operation is performed among program operations. Depending on the decoded row address, the address decoder 120 may apply a program voltage Vpgm generated from the voltage generating unit 150 to a selected word line among the plurality of word lines WL. The address decoder 120 may apply a pass voltage Vpass to remaining unselected word lines. In addition, the address decoder 120 may apply a verifying voltage Vverify generated from the voltage generating unit 150 to a selected word line when a verifying operation is performed among the program operations. Further, the address decoder may apply a pass voltage Vpass to remaining unselected word lines.

The address decoder 120 may be configured to decode a column address from the address ADDR. The address decoder 120 may transfer the decoded column address Yi to the read/write circuit 130.

A program operation of the semiconductor memory device 100 may be performed on a page-by-page basis. The address ADDR received at the time of request for read and program operations may include a block address, the row address and the column address. The address decoder 120 may select one memory block and one word line depending on the block address and the row address. The column address may be decoded by the address decoder 120 and then provided to the read/write circuit 130.

The address decoder 120 may include a block decoder, a row decoder, a column decoder, an address buffer, etc.

The read/write circuit 130 may include a plurality of page buffers PB1 to PBm. The plurality of page buffers PB1 to PBm may be electrically coupled to the memory cell array 110 via the bit lines BL1 to BLm. Each of the plurality of page buffers PB1 to PBm may receive and store a program data temporarily at the time of a program operation. Each of the plurality of page buffers PB1 to PBm may control a potential of a corresponding bit line depending on the program data using a program permission voltage or a program prohibition voltage. The program permission voltage may be re-set by increasing the voltage to a set voltage depending on a result of the verifying operation. Further, each of the plurality of page buffers PB1 to PBm may perform the verifying operation by sensing a program state of a corresponding memory cell.

The read/write circuit 130 may operate in response to the control of the control logic 140.

In an embodiment, the read/write circuit 130 may include page buffers (or page registers), a column selection circuit, etc.

The control logic 140 may be electrically coupled to the address decoder 120, the read/write circuit 130, and the voltage generating unit 150. The control logic 140 may receive a command CMD and a control signal CTRL through the input/output buffer of the semiconductor memory device 100. The command CMD may be provided from the controller 200 (refer to FIG. 1). The control logic 140 may be configured to control all operations of the semiconductor memory device 100 in response to the command CMD. In addition, the control logic 140 may control the address decoder 120, the read/write circuit 130 and the voltage generating unit 150 to output a program voltage, a verifying voltage and a program permission voltage during a program operation.

The voltage generating unit 150 may generate the program voltage Vpgm, the verifying voltage Vverify and the pass voltage Vpass during a program operation. The voltage generating unit 150 may generate a plurality of program voltages Vpgm depending on the control of the control logic 140 each time a program voltage applying operation is performed among the program operations. In each of the program voltage applying operations, the program voltage Vpgm increased as much as a step voltage value may be generated. Further, the step voltage value may be different each time. In addition, a verifying voltage having a different potential level may be generated in each verifying operation.

Figure 3:
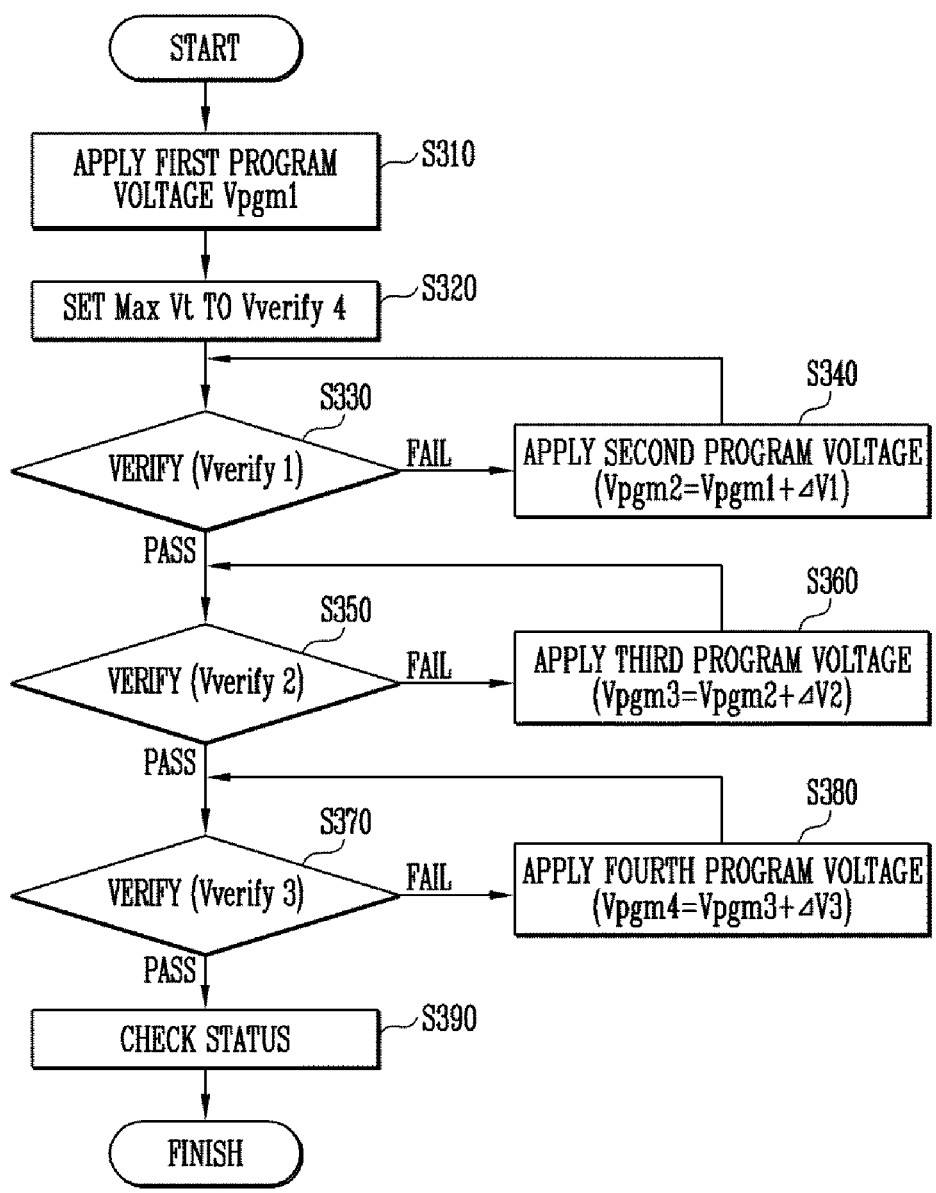
FIG. 3 is a flowchart illustrating a program operation of a semiconductor memory device.

Referring to FIG. 3, a flowchart diagram for describing a semiconductor memory device is shown.

Figure 4:
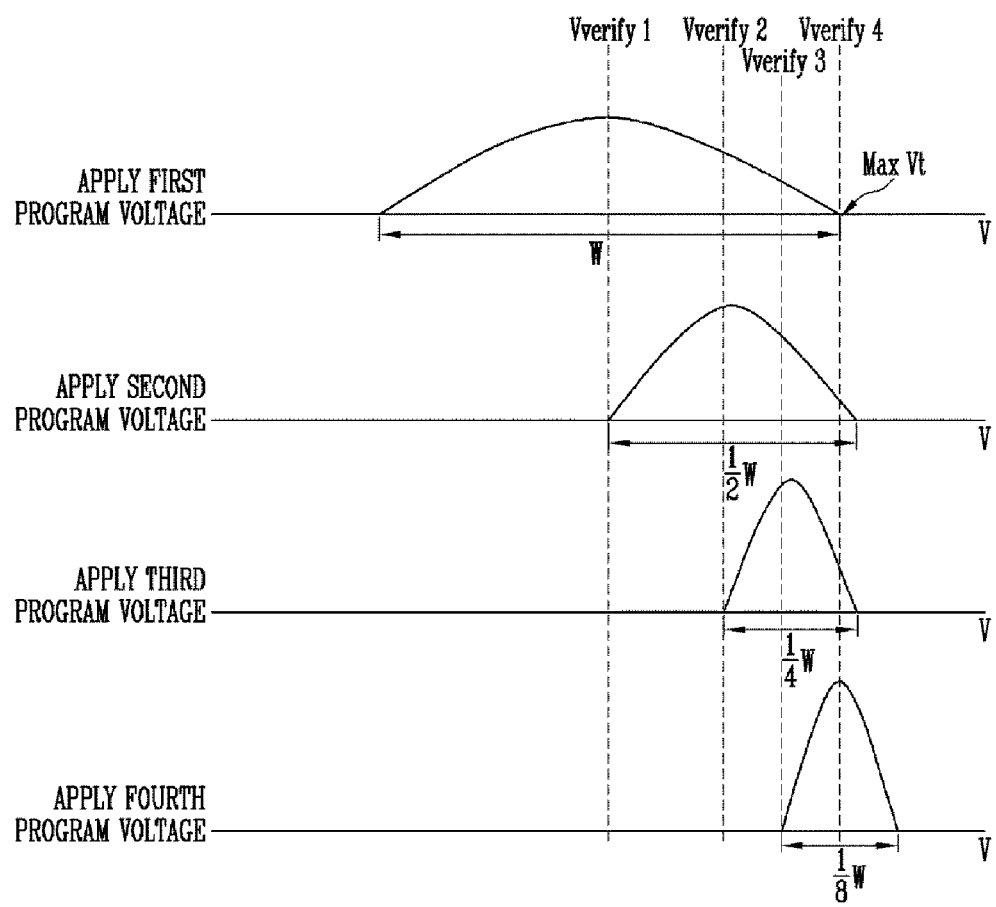
FIG. 4 is a threshold voltage distribution chart illustrating a program operation of a semiconductor memory device.

Referring also to FIG. 4, a threshold voltage distribution diagram for describing an operation of a semiconductor memory device is shown.

In FIGS. 1 to 4, operations of the semiconductor memory device are described below.

(1) Applying First Program Voltage (S310)

A program data may be input and stored temporarily in each page buffer (PB1 to PBm) of the read/write circuit 130. Potential of the bit lines BL1 to BLm may be controlled using a program permission voltage or a program prohibition voltage level depending on the temporarily stored program data. The program permission voltage may be set to 0V.

The voltage generating unit 150 may generate a first program voltage Vpgm1 and a pass voltage Vpass depending on the control of the control logic 140. The first program voltage Vpgm1 generated by the voltage generating unit 150 may be applied to a selected word line among the plurality of word lines WL by the address decoder 120. In addition, the pass voltage Vpass may be applied to unselected word lines among the plurality of word lines WL by the address decoder 120.

(2) Setting Verifying Voltage (S320)

A threshold voltage of a memory cell having a maximum threshold voltage value Max Vt among a threshold voltage distribution of memory cells changed by the first program voltage Vpgm1 may be set to a fourth verifying voltage Vverify4.

(3) First Verifying Operation (S330)

A pass or a fail of the first verifying operation may be determined depending on whether a threshold voltage of the memory cells is higher than or equal to, or lower than, a first verifying voltage Vverify1. For example, when all of the memory cells have a threshold voltage higher than or equal to the first verifying voltage Vverify1, a pass may be determined. Further, when some of the memory cells have a threshold voltage lower than the first verifying voltage Vverify1, a fail may be determined. The first verifying voltage Vverify1 may preferably be a threshold voltage value of the most numerous memory cells from the threshold voltage distribution of the memory cells after the first program voltage applying step (S310). More specifically, it may preferably be ½ of threshold voltage distribution width (W).

(4) Applying Second Program Voltage (S340)

If a fail is determined because some memory cells have a threshold voltage lower than the first verifying voltage Vverify1 as a result of the first verifying operation (S330), a program operation may be performed by applying a second program voltage Vpgm2 to a selected word line. Each of the page buffers PB1 to PBm of the read/write circuit 130 may control a potential of a bit line electrically coupled to memory cells which have threshold voltages higher than or equal to the first verifying voltage Vverify1 to be program prohibition voltage level. Each of the page buffers PB1 to PBm may also control a potential of a bit line electrically coupled to memory cells having threshold voltages lower than the first verifying voltage Vverify1 to be a program permission voltage level. The program permission voltage may be set to 0V.

The second program voltage Vpgm2 may be a voltage increased more than the first program voltage Vpgm1 by a first step voltage ΔV1.

The first step voltage ΔV1 may preferably be ½ of the distribution of threshold voltages of memory cells to which the first program voltage Vpgm1 is applied. For example, if the threshold voltage distribution width W is 1,800 mV, first step voltage ΔV1 value may be set to 0.9V. In addition, the first step voltage ΔV1 value may be a value obtained by subtracting the first verifying voltage Vverify1 from the fourth verifying voltage Vverify4.

After the second program voltage applying step (S340) is performed, it may be preferable to re-perform from the verifying operation (S330).

(5) Verifying Operation (S350)

If a pass is determined from the first verifying operation (S330), a pass or fail of a second verifying operation may be determined depending on whether the threshold voltage of the memory cells is higher than or equal to the second verifying voltage Vverify2. For example, if all of the memory cells have threshold voltages higher than or equal to the second verifying voltage Vverify2, a pass may be determined. Further, when some of the memory cells have threshold voltages lower than the second verifying voltage Vverify2, a fail may be determined. The second verifying voltage Vverify2 may be set to have a middle value between the first verifying voltage Vverify1 and the fourth verifying voltage Vverify4. More specifically, it may be preferable to be ¼ of the threshold voltage distribution width W.

(6) Third Program Voltage Applying (S360)

If a fail is determined as a result of the second verifying operation (S350) because some memory cells have threshold voltages lower than the second verifying voltage Vverify2, a third program voltage Vpgm3 may be applied to a selected word line to perform the program operation. Each of the page buffers PB1 to PBm of the read/write circuit 130 may control the potential of the bit line to which the memory cells having threshold voltages higher than or equal to the second verifying voltage Vverify2 to be the program prohibition voltage level. In addition, each of the page buffers PB1 to PBm may control the potential of the bit line to which the memory cells having threshold voltages lower than the second verifying voltage Vverify2 to be the program permission voltage level. The program permission voltage may be a set voltage that is equal to or higher than 0V. For example, the set voltage may be 0.9V. Each of the page buffers PB1 to PBm, after the first program voltage is applied (S310), may control bit lines electrically coupled to memory cells having threshold voltages between the first verifying voltage Vverify1 and the second verifying voltage Vverify2 among the memory cells that have threshold voltages lower than the second verifying voltage Vverify2 to be the program permission voltage level. In addition, each of the page buffers PB1 to PBm may control bit lines electrically coupled to memory cells, among the memory cells that have threshold voltages lower than the second verifying voltage Vverify2, that have threshold voltages which have moved from a position lower than the first verifying voltage Vverify1 to a position between the first verifying voltage Vverify1 and the second verifying voltage Vverify2 as a result of the second program voltage applying (S330) step to be the program permission voltage level. As a result, program speed of each of the memory cells may be controlled in a substantially uniform manner.

The third program voltage Vpgm3 may be a voltage increased more than the second program voltage Vpgm2 by a second step voltage $\Delta V2$. The second step voltage $\Delta V2$ may be set to be ½ of the first step voltage $\Delta V1$. For example, if the first step voltage $\Delta V1$ is 0.9V, the second step voltage $\Delta V2$ value may be set to 0.45V.

It may be preferable to re-perform from the verifying operation (S350) step after the third program voltage applying (S360) step is performed.

(7) Verifying Operation (S370)

If a pass is determined as a result of the second verifying operation (S350), a pass or fail for a third verifying operation may be determined depending on whether threshold voltages of the memory cells are higher than or equal to, or lower than, a third verifying voltage Vverify3. For example, if all of the memory cells have threshold voltages higher than or equal to the third verifying voltage Vverify3, a pass may be determined. If some of the memory cells have threshold voltages lower than the third verifying voltage Vverify3, a fail may be determined. The third verifying voltage Vverify3 may be set to have a value at the midpoint between the second verifying voltage Vverify2 and the fourth verifying voltage Vverify4. More specifically, it may preferably be ⅛ of the threshold voltage distribution width W.

(8) Fourth Program Voltage Applying (S380)

If a fail is determined because some memory cells have threshold voltages lower than the third verifying voltage Vverify3 as a result of the third verifying operation (S370), a fourth program voltage Vpgm4 may be applied to a selected word line to perform the program operation. Each of the page buffers PB1 to PBm of the read/write circuit 130 may control potential of bit lines electrically coupled to memory cells which have threshold voltages higher than or equal to the third verifying voltage Vverify3 to be the program prohibition voltage level. Further, each of the page buffers PB1 and PBm may control potential of bit lines to which memory cells having threshold voltages lower than the third verifying voltage Vverify3 are electrically coupled to be the program permission voltage level. The program permission voltage may be 0V or a voltage increased more than 0V by the set voltage. The set voltage may be, for example, 0.9. Each of the page buffers PB1 to PBm may control bit lines electrically coupled to memory cells having threshold voltages between the second verifying voltage Vverify2 and the third verifying voltage Vverify3 among the memory cells having threshold voltages lower than the third verifying voltage Vverify3 after the first program voltage applying (S310) to be the program permission voltage level having the set voltage level. In addition, each of the page buffers PB1 to PBm may control bit lines electrically coupled to memory cells having threshold voltages which moved from a position lower than the second verifying voltage Vverify2 to a position between the second verifying voltage Vverify2 and the third verifying voltage Vverify3, among the memory cells having threshold voltages lower than the third verifying voltage Vverify3, to be the program permission level which is 0V. As a result, the program speed of each of the memory cell may be controlled in a substantially uniform manner.

The fourth program voltage Vpgm4 may be a voltage increased more than the third program voltage Vpgm3 by a third step voltage $\Delta V3$. The third step voltage $\Delta V3$ may be set to be ½ of the second step voltage $\Delta V2$. For example, if the second step voltage $\Delta V2$ is 0.45V, the third step voltage $\Delta V3$ value may be set to be 0.225V.

After the fourth program voltage applying (S380) step is performed, it may be preferable to re-perform from the verifying operation (S370).

(9) Status Check Operation (S390)

If a pass is determined as a result of the verifying operation (S380), a status check operation may be performed to determine whether there is a false operation by a page buffer. Moreover, if a pass is determined as a result of the status check operation, the program operation may be terminated.

Figure 5:
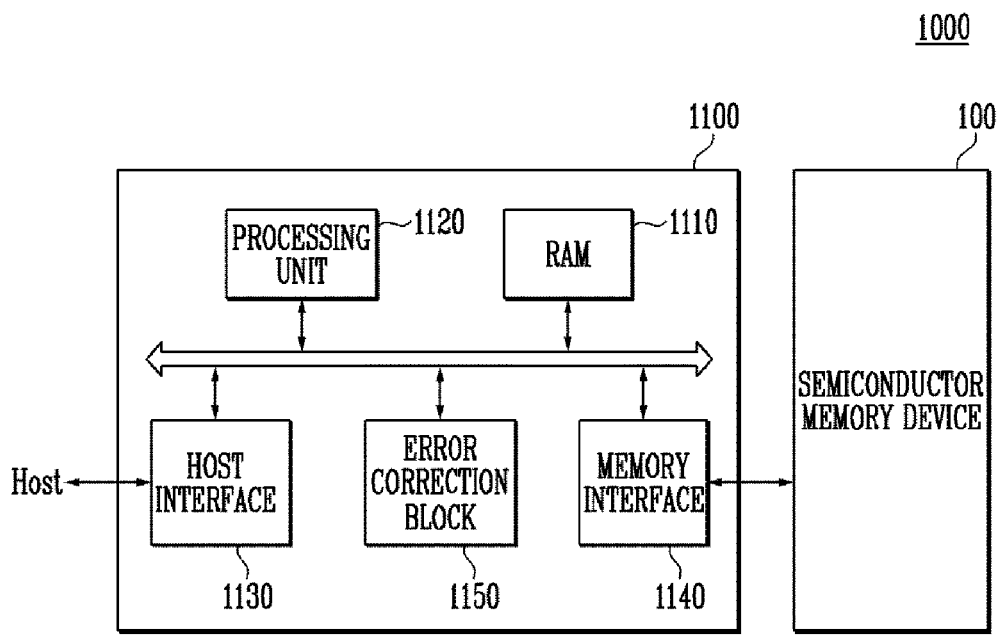
FIG. 5 is a block diagram illustrating a memory system including the semiconductor memory device shown in FIG. 1.

Referring to FIG. 5, a block diagram illustrating a memory system including the semiconductor memory device shown in FIG. 1 is illustrated.

The memory system 1000 may include the semiconductor memory device 100 and a controller 1100.

The semiconductor memory device 100 may be configured and may operate as described above with reference to FIG. 1. Hereinafter, repeated description will be omitted.

The controller 1100 may include a function of the controller 200 described with reference to FIG. 1. The controller 1100 may be electrically coupled to a host Host and the semiconductor memory device 100. The controller 1100 may be configured to access the semiconductor memory device 100 in response to a request from the host Host. For example, the controller 1100 may be configured to control read, write, erase, and background operations of the semiconductor memory device 100. The controller 1100 may be configured to provide interfacing between the semiconductor memory device 100 and the host Host. The controller 1100 may be configured to drive a firmware to control the semiconductor memory device 100.

The controller 1100 may include a random access memory (RAM) 1110, a processing unit 1120, a host interface unit 1130, a memory interface unit 1140, and an error correcting block 1150. The RAM 1110 may be used as at least one of an operating memory of the processing unit 1120, a cache memory between the semiconductor memory device 100 and the host, and a buffer memory between the semiconductor memory device 100 and the host Host. The processing unit 1120 may control various operations of the controller 1100. The controller 1100 may temporarily store program data provided by the host Host during a write operation.

The host interface unit 1130 may include a protocol to support data communication operations between the host Host and the controller 1100. In an embodiment, the controller 1200 may communicate with the host Host using at least one protocol selected from a Universal Serial Bus (USB) protocol, a MultiMediaCard (MMC) protocol, a Peripheral Component Interconnect (PCI) protocol, a PCI-Express protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, and an Integrated Drive Electronics (IDE) protocol, a private protocol, etc.

The memory interface unit 1140 may provide an interface with the semiconductor memory device 100. For example, the memory interface unit 1140 may include a NAND interface or a NOR interface.

The error correcting block 1150 may perform same functions as the error correction block 210 shown in FIG. 1. The error correcting block 1150 be configured to detect an error associated with data received from the semiconductor memory device 100 using an error correcting code (ECC). Further, the error correcting block 1150 may correct the detected error. The processing unit 1120 may adjust a read voltage according to an error detection result generated by the error correcting block 1150. In addition, the processing unit 1120 may control the semiconductor memory device 100 to perform the read operation again. In an embodiment, the error correcting block 1150 may be a component of the controller 1100.

The controller 1100 and the semiconductor memory device 100 may be integrated into a single semiconductor device. In an embodiment, the controller 1100 and the semiconductor memory device 100 may be configured as a memory card by being integrated into a single semiconductor device. For example, the controller 1100 and the semiconductor memory device 100 may be configured as a memory card such as a Personal Computer Memory Card International Association (PCMCIA) Card, a CompactFlash (CF) card, a SmartMedia (SM) card (SMC), a Memory Stick, an MMC, a reduced sized MMC (RS-MMC), a micro sized MMC (MMCmicro), a Secure Digital (SD) card, a mini SD (miniSD) card, a micro SD (microSD) card, an SD high capacity (SDHC) card, a Universal Flash Storage (UFS) device, etc., by being integrated into a single semiconductor device.

The controller 1100 and the semiconductor memory device 100 may be configured as a solid state drive (SSD) by being integrated into a single semiconductor device. The SSD may include a storage device configured to store data in the semiconductor memory device. When the memory system 1000 is used as the SSD, an operating speed of the host Host electrically coupled to the memory system 1000 may be improved.

In an embodiment, the memory system 1000 may be one of a number of different components of an electronic device such as for example a computer, an ultra mobile personal computer (UMPC), a workstation, a net-book, a personal digital assistant (PDA), a portable computer, a web tablet, a wireless phone, a mobile phone, a smart phone, e-book, a portable multimedia player, a game console, a navigation device, a black box, a digital camera, a three-dimensional television, a digital audio recorder, a digital audio player, a digital picture recorder, a digital picture player, a digital video recorder, a digital video player, a device for wirelessly transmitting and receiving information, etc. In addition, the memory system 1000 may be a component of one of a number of different electronic devices to configure a home network, electronic devices to configure a computer network, to configure a telematics network, a radio frequency identification (RFID) device, or to configure a computing system.

In an embodiment, the memory device 100 or the memory system 1000 may be packaged using one or a number of different types of packages. The semiconductor memory device 100 or the memory system 1000 may, for example, be packaged and mounted using a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 6:
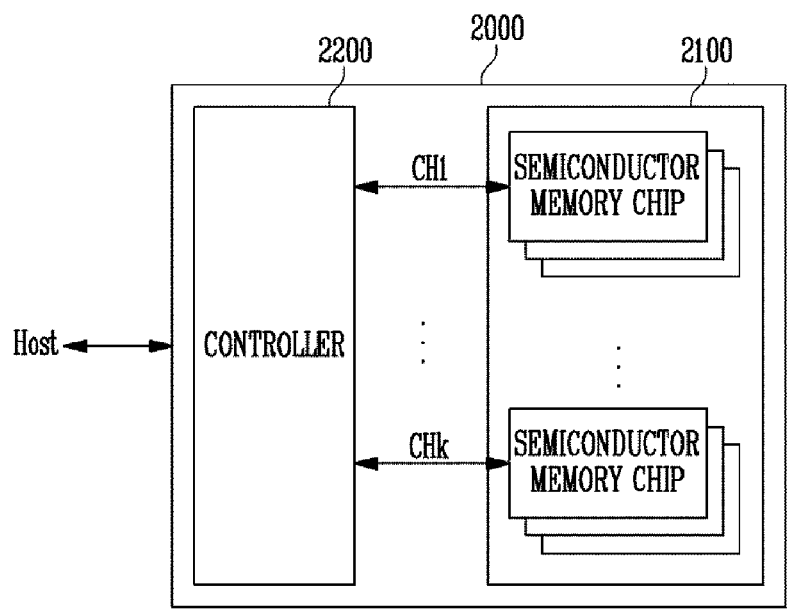
FIG. 6 is a block diagram illustrating an example of an application of the memory system shown in FIG. 5.

Referring to FIG. 6, a block diagram representation of an application of an example of the memory system shown in FIG. 5 is illustrated.

The memory system 2000 may include a semiconductor memory device 2100 and a controller 2200. The semiconductor memory device 2100 may include a plurality of semiconductor memory chips. The plurality of semiconductor memory chips may be divided into a plurality of groups.

The plurality of groups may communicate with the controller 2200 through each of first to $k^{th}$ channels CH1-CHk. Each of the semiconductor memory chips may have substantially the same construction and operation in substantially the same manner as the semiconductor memory device 100 described with reference to FIG. 1.

Each of the plurality of groups may be configured to communicate with the controller 2200 via a single common channel. The controller 2200 may be configured to have substantially the same construction as the controller 1100 described with reference to FIG. 5. In addition, the controller 2200 may control the operation of the plurality of memory chips of the semiconductor memory device 2100 through the plurality of channels CH1-CHk.

Figure 7:
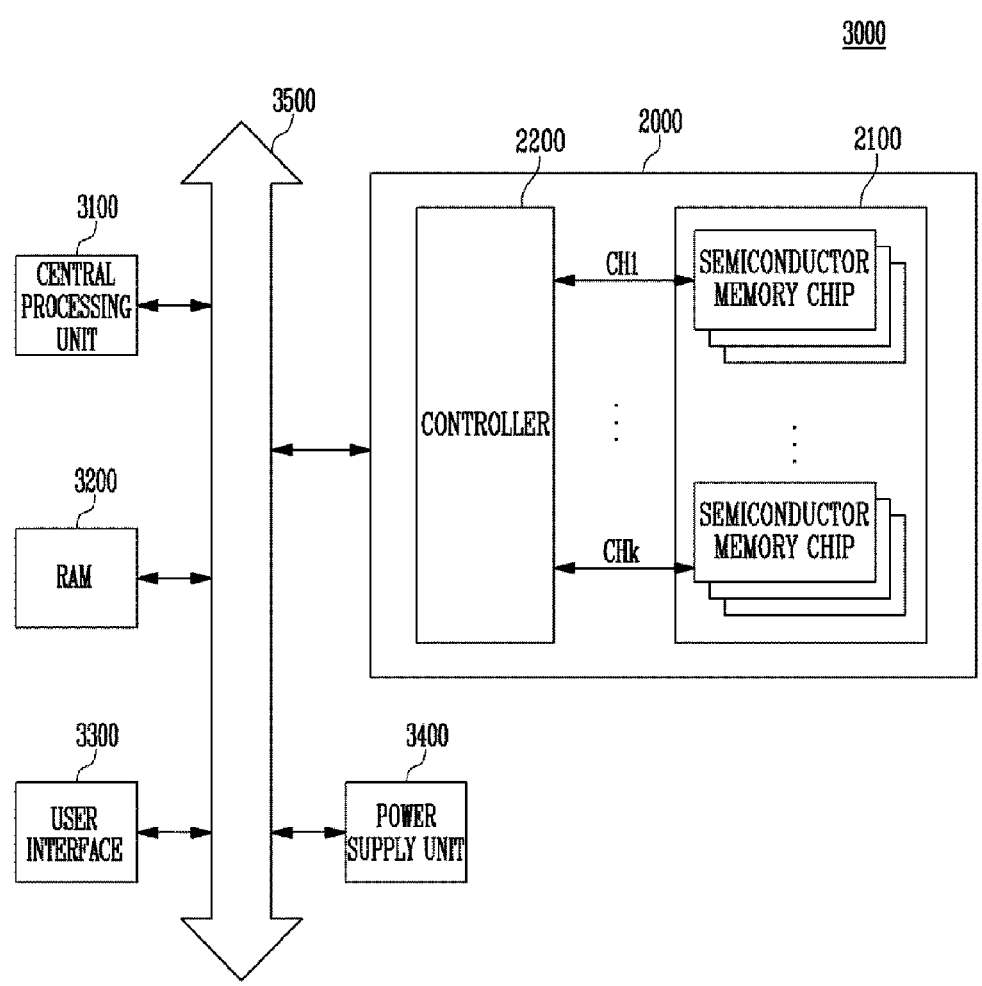
FIG. 7 is a block diagram illustrating a computing system including the memory system described with reference to FIG. 6.

Referring to FIG. 7, a block diagram representation of a computing system including the memory system described with reference to FIG. 6 is illustrated.

The computing system 3000 may include a central processing unit 3100, a RAM 3200, a user interface unit 3300, a power supply unit 3400, a system bus 3500, and a memory system 2000.

The memory system 2000 may be electrically coupled to the central processing unit 3100, the RAM 3200, the user interface unit 3300, and the power supply unit 3400 through the system bus 3500. Data provided via the user interface unit 3300 or processed by the central processing unit 3100 may be stored in the memory system 2000.

In FIG. 7, the semiconductor memory device 2100 is shown as being electrically coupled to the system bus 3500 via the controller 2200. However, the semiconductor memory device 2100 may be electrically coupled to the system bus 3500 directly. In this case, the function of the controller 2200 may be performed by the central processing unit 3100 and the RAM 3200.

In FIG. 7, the memory system 2000 described with reference to FIG. 6 is shown as being used in the computing system 3000. However, the memory system 2000 may be replaced by the memory system 1000 described with reference to FIG. 5. In an embodiment, the computing system 3000 may be configured to include both of the memory systems 1000, 2000 described with reference to FIGS. 6 and 5.

While certain embodiments have been described above, it will be understood to those skilled in the art that the embodiments described are by way of example only. Accordingly, the semiconductor memory devices, the memory system having the semiconductor memory devices and methods of operating the semiconductor memory devices described should not be limited based on the described embodiments. Rather, the semiconductor memory devices, memory system having the semiconductor memory devices and the methods of operating the semiconductor memory devices described should only be limited in light of the claims that follow when taken in conjunction with the above description and accompanying drawings.

Embodiments have been disclosed in the drawings and the specification as described above. The specific terms used herein are for purposes of illustration and do not limit the scope of the invention as defined by the claims. Accordingly, those skilled in the art will appreciate that various modifications and another equivalent examples may be made without departing from the scope and spirit of the disclosure. Therefore, the sole scope of technical protection of the invention will be defined by the technical spirit of the accompanying claims.

What is claimed is:

1. A semiconductor memory device, comprising:
   a memory cell array including a plurality of memory cells;
   a peripheral circuit unit configured to perform a program operation with respect to a memory cell selected from the plurality of memory cells, wherein first to third program voltage applying operations and first to third verifying operations are alternatively performed; and
   a control logic configured to control the peripheral circuit unit to perform the first to third program voltage applying operations and the first to third verifying operations and to increase a second program voltage applied during the second program voltage applying operation more than a first program voltage applied during the first program applying operation by a first step voltage and a third program voltage applied during the third program voltage applying operation more than the second program voltage by a second step voltage, wherein a first verifying voltage used in the first verifying operation has a voltage value at or around a half (½) point of a threshold voltage distribution width of the memory cells after the first program voltage applying operation is performed.

2. The semiconductor memory device of claim 1, wherein the control logic controls the peripheral circuit unit to perform a fourth program voltage applying operation using a fourth program voltage depending on a result of the third verifying operation after the third verifying operation is performed, wherein the fourth program voltage is a voltage increased from the third program voltage by a third step voltage.

3. The semiconductor memory device of claim 2, wherein the second step voltage is half (½) the first step voltage and the third step voltage is half (½) the second step voltage.

4. The semiconductor memory device of claim 2, wherein a first verifying voltage used in the first verifying operation is a threshold voltage value of most numerous memory cells in a threshold voltage distribution of the memory cells after the first program voltage applying operation is performed.

5. The semiconductor memory device of claim 4, wherein a second verifying voltage used in the second verifying operation is a middle voltage between a threshold voltage of a memory cell having a maximum threshold voltage value among the memory cells and the first verifying voltage after the first program voltage applying operation is performed.

6. The semiconductor memory device of claim 5, wherein a third verifying voltage used in the third verifying operation is a middle voltage between a threshold voltage of a memory cell having a maximum threshold voltage value among the memory cells and the second verifying voltage after the first program voltage applying operation is performed.

7. The semiconductor memory device of claim 6, wherein the peripheral circuit unit comprises:
   a read/write circuit configured to control a potential level of bit lines of the memory cell array depending on a program data input during a program operation; and
   a voltage generating unit configured to apply the first to fourth program voltages and the first to third verifying voltages to a selected memory cell depending on a control of the controller logic.

8. The semiconductor memory device of claim 7, wherein the read/write circuit performs the second program voltage applying operation by setting potential of bit lines electrically coupled to memory cells determined as having failed as a result of the first verifying operation to a program permission voltage level.

9. The semiconductor memory device of claim 7, wherein the read/write circuit performs the third program voltage applying operation by setting potential of bit lines electrically coupled to memory cells determined as having failed as a result of the second verifying operation to a program permission voltage level, sets bit lines electrically coupled to memory cells, among the memory cells determined as having failed, having threshold voltages between the first verifying voltage and the second verifying voltage after the first program voltage is applied to a first program permission voltage level, and sets bit lines electrically coupled to memory cells having threshold voltages which move from a position lower than the first verifying voltage to a position between the first verifying voltage and the second verifying voltage due to the second program voltage applying operation to a second program permission verifying voltage level lower than the first program permission voltage level.

10. The semiconductor memory device of claim 7, wherein the read/write circuit performs the third program voltage applying operation by setting potential of bit lines electrically coupled to memory cells determined as having failed as a result of the third verifying operation to a program permission voltage level, sets bit lines electrically coupled to memory cells, among the memory cells determined as having failed, having threshold voltages between the second verifying voltage and the third verifying voltage after the first program voltage is applied to a first program permission voltage level, and sets bit lines electrically coupled to memory cells having threshold voltages which move from a position lower than the second verifying voltage to a position between the second verifying voltage and the third verifying voltage due to the third program voltage applying operation to a second program permission verifying voltage level lower than the first program permission voltage level.

11. A memory system, comprising:
a semiconductor memory device including a plurality of programmable memory cells; and
a controller configured to control a program operation of the semiconductor memory device upon receipt of a program command from a host,
wherein the semiconductor memory device alternately performs first to fourth program operations and first to third verifying operations depending on a control of the controller,
wherein a second program voltage applied during the second program voltage applying operation is increased more than a first program voltage applied during the first program voltage applying operation by a first step voltage,
wherein a third program voltage applied during the third program voltage applying operation is increased more than a second program voltage by a second step voltage,
wherein a fourth program voltage applied during the fourth program voltage applying operation is increased more than the third program voltage by a third step voltage,
wherein the first step voltage is greater than the second step voltage and the second step voltage is greater than the third step voltage.

12. The memory system of claim 11, wherein the second step voltage is half (½) the first step voltage and the third step voltage is half (½) the second step voltage.

13. The memory system of claim 11, comprising:
a memory cell array including the plurality of memory cells;
a peripheral circuit unit configured to perform a program operation with respect to a memory cell among the plurality of memory cells; and
a control logic configured to control the peripheral circuit unit to perform the first to fourth program operations and the first to third verifying operations according to the control of the controller.

14. The memory system of claim 11, wherein a first verifying voltage used in the first verifying operation has a voltage value at or around a half (½) point of a threshold voltage distribution width of the memory cells after the first program voltage applying operation is performed.

15. The memory system of claim 11,
wherein a second verifying voltage used in the second verifying operation is a middle voltage between a threshold voltage of a memory cell having a maximum threshold voltage value among the memory cells and the first verifying voltage after the first program voltage applying operation is performed,
wherein a third verifying voltage used in the third verifying operation is a middle voltage between a threshold voltage of a memory cell having a maximum threshold voltage value among the memory cells and the second verifying voltage after the first program voltage applying operation is performed.

16. The memory system of claim 13, wherein the peripheral circuit unit comprises:
a read/write circuit configured to control a potential level of bit lines of the memory cell array depending on a program data input during a program operation; and
a voltage generating unit configured to apply the first to fourth program voltages and the first to third verifying voltages to a selected memory cell depending on a control of the controller logic.

17. The memory system of claim 16, wherein the read/write circuit performs the third program voltage applying operation by setting potential of bit lines electrically coupled to memory cells determined as having failed as a result of the second verifying operation to a program permission voltage level, sets bit lines electrically coupled to memory cells, among the memory cells determined as having failed, having threshold voltages between the first verifying voltage and the second verifying voltage after the first program voltage is applied to a first program permission voltage level, and sets bit lines electrically coupled to memory cells having threshold voltages which move from a position lower than the first verifying voltage to a position between the first verifying voltage and the second verifying voltage due to the second program voltage applying operation to a second program permission verifying voltage level lower than the first program permission voltage level.

18. The memory system of claim 16, wherein the read/write circuit performs the third program voltage applying operation by setting potential of bit lines electrically coupled to memory cells determined as having failed as a result of the third verifying operation to a program permission voltage level, sets bit lines electrically coupled to memory cells, among the memory cells determined as having failed, having threshold voltages between the second verifying voltage and the third verifying voltage after the first program voltage is applied to a first program permission voltage level, and sets bit lines electrically coupled to memory cells having threshold voltages which move from a position lower than the second verifying voltage to a position between the second verifying voltage and the third verifying voltage due to the third program voltage applying operation to a second program permission verifying voltage level lower than the first program permission voltage level.

19. A method of operating a semiconductor memory device, comprising:
performing a first program voltage applying operation by applying a first program voltage to a plurality of memory cells;
performing a first verifying operation by setting a maximum threshold voltage value from a threshold voltage distribution of the plurality of memory cells to a fourth verifying voltage;
setting a half (½) point of a width of the threshold voltage distribution to a first verifying voltage and using the first verifying operation voltage;
performing a second program voltage applying operation using a second program voltage increased by more than the first program voltage by a first step voltage when a fail is determined as a result of the first verifying operation;

performing a second verifying operation by setting a middle voltage between the first verifying voltage and the fourth verifying voltage to a second verifying voltage and using the second verifying voltage; and performing a third program voltage applying operation using a third program voltage increased by more than the second program voltage by a second step voltage when a fail is determined as a result of the second verifying operation.

20. The method of claim 19, further comprising, after the third program voltage applying operation:

performing a third verifying operation by setting a middle voltage of the second verifying voltage and the fourth verifying voltage to a third verifying voltage and using the third verifying voltage; and performing a fourth verifying operation by using a fourth program voltage increased by more than the third program voltage by a third step voltage when a fail is determined as a result of the third verifying operation.

21. The method of claim 20, wherein the second step voltage is half (½) the first step voltage and the third step voltage is half (½) the second step voltage.

22. The method of claim 20, performing:

setting potential of bit lines electrically coupled to memory cells determined as having failed as a result of the second verifying operation as a program permission voltage level;

setting bit lines electrically coupled to memory cells, among the memory cells determined as having failed, having threshold voltages between the first verifying voltage and the second verifying voltage after the first program voltage is applied to a first program permission voltage level; and setting bit lines electrically coupled to memory cells having threshold voltages which move from a position lower than the first verifying voltage to a position between the first verifying voltage and the second verifying voltage due to the second program voltage applying operation to a second program permission verifying voltage level lower than the first program permission voltage level.

23. The method of claim 20, further comprising:

performing the third program voltage applying operation by setting potential of bit lines electrically coupled to memory cells determined as having failed as a result of the third verifying operation as a program permission voltage level;

setting bit lines electrically coupled to memory cells, among the memory cells determined as having failed, having threshold voltages between the second verifying voltage and the third verifying voltage after the first program voltage is applied as a first program permission voltage level; and setting bit lines electrically coupled to memory cells having threshold voltages which move from a position lower than the second verifying voltage to a position between the second verifying voltage and the third verifying voltage due to the third program voltage applying operation to a second program permission verifying voltage level lower than the first program permission voltage level.

* * * * *